United States Patent
Liu et al.

(10) Patent No.: US 11,069,725 B2
(45) Date of Patent: Jul. 20, 2021

(54) DISPLAY SUBSTRATE AND METHOD OF PREPARING THE SAME, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Jun Liu, Beijing (CN); Luke Ding, Beijing (CN); Ning Liu, Beijing (CN); Wei Li, Beijing (CN); Bin Zhou, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/399,508

(22) Filed: Apr. 30, 2019

(65) Prior Publication Data

US 2020/0098797 A1 Mar. 26, 2020

(30) Foreign Application Priority Data

Sep. 20, 2018 (CN) .......................... 201811098275.8

(51) Int. Cl.
*H01L 27/12* (2006.01)
*H01L 21/311* (2006.01)
*H01L 21/3213* (2006.01)

(52) U.S. Cl.
CPC .... *H01L 27/1288* (2013.01); *H01L 21/31116* (2013.01); *H01L 21/31144* (2013.01);
(Continued)

(58) Field of Classification Search
None
See application file for complete search history.

(56) References Cited

U.S. PATENT DOCUMENTS 7,259,045 B2 * 8/2007 Dejima ............... H01L 27/1214
438/149
7,914,971 B2 * 3/2011 Ohnuma ............ H01L 27/1214
430/311
(Continued)

FOREIGN PATENT DOCUMENTS

CN          1388406 A       1/2003
CN        101958339 A       1/2011
(Continued)

OTHER PUBLICATIONS

Fist Office Action from The Stat Property Office of People's Republic of China dated Apr. 27, 2020 (Year: 2020).*
(Continued)

*Primary Examiner* — Telly D Green
(74) *Attorney, Agent, or Firm* — Kinney & Lange, P.A.

(57) ABSTRACT

A display substrate and a method of preparing the same, and a display device are provided, the method including: providing a substrate; forming a switching thin film transistor precursor and a driving thin film transistor precursor on the substrate, each including a semiconductor layer, a gate insulating material layer and a gate metallic layer stacked sequentially above the substrate; forming a photoresist layer above the switching thin film transistor precursor and the driving thin film transistor precursor, and forming an etching mask from the photoresist layer, a first portion of the etching mask at the switching thin film transistor precursor and a second portion of the etching mask at the driving thin film transistor precursor having different shapes; and forming a switching thin film transistor and a driving thin film tran-
(Continued)

sistor, by etching processing the switching thin film transistor precursor and the driving thin film transistor precursor with the etching mask.

9 Claims, 5 Drawing Sheets

(52) U.S. Cl.
CPC .. *H01L 21/32134* (2013.01); *H01L 21/32139* (2013.01); *H01L 27/127* (2013.01); *H01L 27/1237* (2013.01)

(56) References Cited

U.S. PATENT DOCUMENTS

| | | | |
|---|---|---|---|
| 8,212,247 B2 | 7/2012 | Kang et al. | |
| 8,586,453 B2* | 11/2013 | Yoo | G03F 7/0035 257/E21.09 |
| 9,356,260 B2 | 5/2016 | Hsu | |
| 9,536,934 B2 | 1/2017 | Kang | |
| 9,614,017 B2 | 4/2017 | Li et al. | |
| 9,627,515 B2* | 4/2017 | Satoh | H01L 29/41 |
| 9,634,038 B2 | 4/2017 | Kwon et al. | |
| 9,741,750 B2 | 8/2017 | Jiang | |
| 9,748,280 B2 | 8/2017 | Long et al. | |
| 9,837,477 B2 | 12/2017 | Chen et al. | |
| 10,559,639 B2 | 2/2020 | Shi | |
| 10,644,160 B2 | 5/2020 | Chen et al. | |
| 10,923,512 B2 | 2/2021 | Liu et al. | |
| 2005/0250265 A1* | 11/2005 | Paik | H01L 29/42384 438/163 |
| 2006/0006392 A1* | 1/2006 | Sonoda | H01L 27/124 257/72 |
| 2006/0292778 A1* | 12/2006 | Sekiguchi | H01L 27/1288 438/197 |
| 2007/0037070 A1* | 2/2007 | Ohnuma | H01L 27/1214 430/5 |
| 2009/0261337 A1* | 10/2009 | Sakakura | H01L 29/78645 257/72 |
| 2011/0170084 A1* | 7/2011 | Ohnuma | H01L 27/1288 355/71 |
| 2012/0094472 A1* | 4/2012 | Yoo | H01L 27/1288 438/478 |
| 2012/0261666 A1* | 10/2012 | Yen | H01L 27/1288 257/59 |
| 2014/0048826 A1* | 2/2014 | Gao | H01L 29/78642 257/88 |
| 2014/0070206 A1* | 3/2014 | Dai | H01L 21/76841 257/43 |
| 2014/0183519 A1* | 7/2014 | Ning | H01L 27/1225 257/43 |
| 2014/0312349 A1* | 10/2014 | Jiang | H01L 21/26526 257/66 |
| 2014/0353660 A1* | 12/2014 | Jung | H01L 27/1225 257/43 |
| 2016/0133681 A1* | 5/2016 | Nam | H01L 51/5265 257/40 |
| 2016/0155828 A1* | 6/2016 | Sugawara | H01L 21/02323 438/104 |
| 2016/0254285 A1 | 9/2016 | Long et al. | |
| 2016/0365361 A1 | 12/2016 | Jiang | |
| 2017/0077201 A1 | 3/2017 | Chen et al. | |
| 2017/0179164 A1* | 6/2017 | Choi | H01L 29/42384 |
| 2017/0271422 A1 | 9/2017 | Kim et al. | |
| 2019/0043996 A1* | 2/2019 | Liu | H01L 29/7869 |
| 2019/0051677 A1* | 2/2019 | Liu | H01L 27/1259 |
| 2019/0074306 A1* | 3/2019 | Liu | H01L 29/78633 |

FOREIGN PATENT DOCUMENTS

| | | | |
|---|---|---|---|
| CN | 103456765 A | | 12/2013 |
| CN | 103715226 A | | 4/2014 |
| CN | 104282769 A | | 1/2015 |
| CN | 104637874 A | | 5/2015 |
| CN | 104638017 A | | 5/2015 |
| CN | 104952884 A | | 9/2015 |
| CN | 105702743 A | | 6/2016 |
| CN | 106298857 A | | 1/2017 |
| CN | 106444179 A | | 2/2017 |
| CN | 106935659 A | | 7/2017 |
| CN | 107004682 A | | 8/2017 |
| CN | 107146855 A | | 9/2017 |
| CN | 107170759 A | * | 9/2017 |
| CN | 107170759 A | | 9/2017 |
| CN | 107204354 A | | 9/2017 |
| CN | 107403758 A | | 11/2017 |
| JP | 2010152059 A | | 7/2010 |

OTHER PUBLICATIONS

First Chinese Office Action dated Apr. 27, 2020, received for corresponding Chinese Application No. 201811098275.8, 20 pages.
Second Chinese Office Action dated Mar. 11, 2021, received for corresponding Chinese Application No. 201811098275.8, 24 pages.

* cited by examiner

DISPLAY SUBSTRATE AND METHOD OF PREPARING THE SAME, AND DISPLAY DEVICE

CROSS-REFERENCE TO RELATED APPLICATION

The present application claims the benefit of Chinese Patent Application Invention No. 201811098275.8 filed on Sep. 20, 2018 in the State Intellectual Property Office of China, the whole disclosure of which is incorporated herein by reference.

BACKGROUND

Technical Field

Embodiments of the present disclosure generally relate to the technical field of display technology, and in particular, to a display substrate and a method of preparing the same, and a display device.

Description of the Related Art

In recent years, organic light emitting display (abbreviated as OLED) has gradually become a research hotspot in the field of display, due to its properties such as self-illumination, relatively high contrast, and relatively wide view angle. With a rapid development of the display technology, there is an increasingly apparent tendency that dimensions of the display devices gradually become larger, and thus a large-sized OLED gradually becomes a new growth point in the field of display. As compared with liquid crystal display technology, in order to ensure display effect of OLED, then, an OLED display device constructed on the basis of organic light emitting display technology may typically have a back-plate having an even more complex circuit structure, and comprise or be associated with a plurality of switching components for accurately control light-emitting condition of each light-emitting diode within the OLED display device. Thin film transistors (TFT) in a present display panel mainly comprises two types, i.e., switching TFTs and driving TFTs. A switching TFT is for example configured to control switching on and switching off of a respective driving TFT; and the respective driving TFT is configured to further drive a respective light-emitting diode to emit light once the driving TFT is driven by the switching TFT to switch on and in turn to reach a saturation condition, so as to implement a functionality of display of the OLED display device.

However, it is still required to improve the present display substrate, the method of preparing the same, and the display device.

SUMMARY

The embodiments of the present disclosure have been made to overcome or alleviate at least one aspect of the above mentioned disadvantages and/or shortcomings in the prior art, by providing a display substrate and a method of preparing the same, and a display device.

Following technical solutions are adopted in exemplary embodiments of the invention.

According to one aspect of embodiments of the disclosure, there is provided method of preparing a display substrate, comprising:

providing a substrate;

forming a switching thin film transistor precursor and a driving thin film transistor precursor on the substrate respectively, each of the switching thin film transistor precursor and the driving thin film transistor precursor comprising a semiconductor layer, a gate insulating material layer and a gate metallic layer which are stacked sequentially above the substrate;

forming a photoresist layer above the switching thin film transistor precursor and the driving thin film transistor precursor, and forming an etching mask from the photoresist layer, a portion of the etching mask at the switching thin film transistor precursor and a portion of the etching mask at the driving thin film transistor precursor having different shapes; and forming a switching thin film transistor and a driving thin film transistor, by performing an etching processing on the switching thin film transistor precursor and the driving thin film transistor precursor with the etching mask.

According to an exemplary embodiment of the present disclosure, the step of "performing the etching processing on the switching thin film transistor precursor and the driving thin film transistor precursor" comprises:

forming a gate of the switching thin film transistor and a gate of the driving thin film transistor respectively, by performing a wet etching on the gate metallic layer with the etching mask;

forming a gate insulating layer of the switching thin film transistor and a gate insulating layer of the driving thin film transistor respectively, by performing a dry etching on the gate insulating material layer with the etching mask; and forming an active layer and connecting lines of the switching thin film transistor and an active layer and connecting lines of the driving thin film transistor, by transforming a portion of the semiconductor layer in a region outside a channel region into a conductor.

According to an exemplary embodiment of the present disclosure, the etching mask is formed by a half-tone mask exposure technology;

a thickness of the portion of the etching mask at the switching thin film transistor precursor is larger than a thickness of the portion of the etching mask at the driving thin film transistor precursor;

a slope angle of the portion of the etching mask at the switching thin film transistor precursor is larger than a slope angle of portion of the etching mask at the driving thin film transistor precursor.

According to an exemplary embodiment of the present disclosure, the thickness of portion of the etching mask at the switching thin film transistor precursor is 1.8 to 2.0 micrometers, and the slope angle of portion of the etching mask at the switching thin film transistor precursor is greater than or equal to 70 degrees; and the thickness of portion of the etching mask at the driving thin film transistor precursor is 1.0 to 1.2 micrometers, and the slope angle of portion of the etching mask at the driving thin film transistor precursor is greater than or equal to 30 degrees.

According to an exemplary embodiment of the present disclosure, a line width of the gate insulating layer of the switching thin film transistor is larger than a line width of the gate insulating layer of the driving thin film transistor.

According to an exemplary embodiment of the present disclosure, a line width of the active layer of the switching thin film transistor is larger than a line width of the active layer of the driving thin film transistor.

According to an exemplary embodiment of the present disclosure, a gas which is used to perform the dry etching is a gas mixture of $CF_4$ and $O_2$;

a gas flow of $CF_4$ is 2200 to 1800 sccm, and a gas flow of $O_2$ is 1000 to 1400 sccm, and a percentage of $O_2$ within the gas mixture is 30% to 40%.

According to an exemplary embodiment of the present disclosure, the step of "forming the switching thin film transistor precursor and the driving thin film transistor precursor on the substrate respectively" comprises:

forming the semiconductor layer on the substrate;

forming the gate insulating material layer on a side of the semiconductor layer facing away from the substrate; and forming the gate metallic layer on a side of the gate insulating material layer facing away from the semiconductor layer.

According to an exemplary embodiment of the present disclosure, prior to "forming the semiconductor layer", the step of "forming the switching thin film transistor precursor and the driving thin film transistor precursor on the substrate respectively" further comprises:

forming a light-shielding layer of the switching thin film transistor precursor and a light-shielding layer of the driving thin film transistor precursor, by forming a light-shielding metal layer on the substrate and patterning the light-shielding metal layer; and forming a buffer layer on a side of the light-shielding layer of the switching thin film transistor precursor facing away from the substrate and on a side of the light-shielding layer of the driving thin film transistor precursor facing away from the substrate.

According to an exemplary embodiment of the present disclosure, after the step of "performing the etching processing on the switching thin film transistor precursor and the driving thin film transistor precursor", the method further comprises:

removing the etching mask;

forming an interlay dielectric layer, on a side of the gate of the switching thin film transistor facing away from the substrate and on a side of the gate of the driving thin film transistor facing away from the substrate;

forming source/drain electrode of the switching thin film transistor and source/drain electrode of the driving thin film transistor, on a side of the interlay dielectric layer facing away from the substrate; and forming a passivation layer on a side of the source/drain electrode of the switching thin film transistor facing away from the substrate and on a side of the source/drain electrode of the driving thin film transistor facing away from the substrate.

According to another aspect of the exemplary embodiment of the present disclosure, there is provided a display substrate, comprising: a substrate; and a switching thin film transistor and a driving thin film transistor on the substrate, an active layer of the switching thin film transistor and an active layer of the driving thin film transistor are formed in a same layer by a same material, and each of the switching thin film transistor and the driving thin film transistor has respective connecting lines formed by a transformation of the material of the active layers into conductor, a line width of the connecting lines of the switching thin film transistor being smaller than a line width of the connecting lines of the driving thin film transistor.

According to an exemplary embodiment of the present disclosure, a slope angle of the gate insulating layer of the switching thin film transistor ranges between 50 and 60 degrees, and a slope angle of the gate insulating layer of the driving thin film transistor ranges between 30 and 40 degrees.

According to still another aspect of the exemplary embodiment of the present disclosure, there is provided a display device, comprising the display substrate prepared with the method as above.

According to yet another aspect of the exemplary embodiment of the present disclosure, there is provided a display device, comprising the display substrate

BRIEF DESCRIPTION OF THE DRAWINGS

The above and/or additional aspects and advantages of the present disclosure will become apparent and easily understood from the following description of embodiments in conjunction with the accompanying drawings, in which.

DETAILED DESCRIPTION

Figure 1:
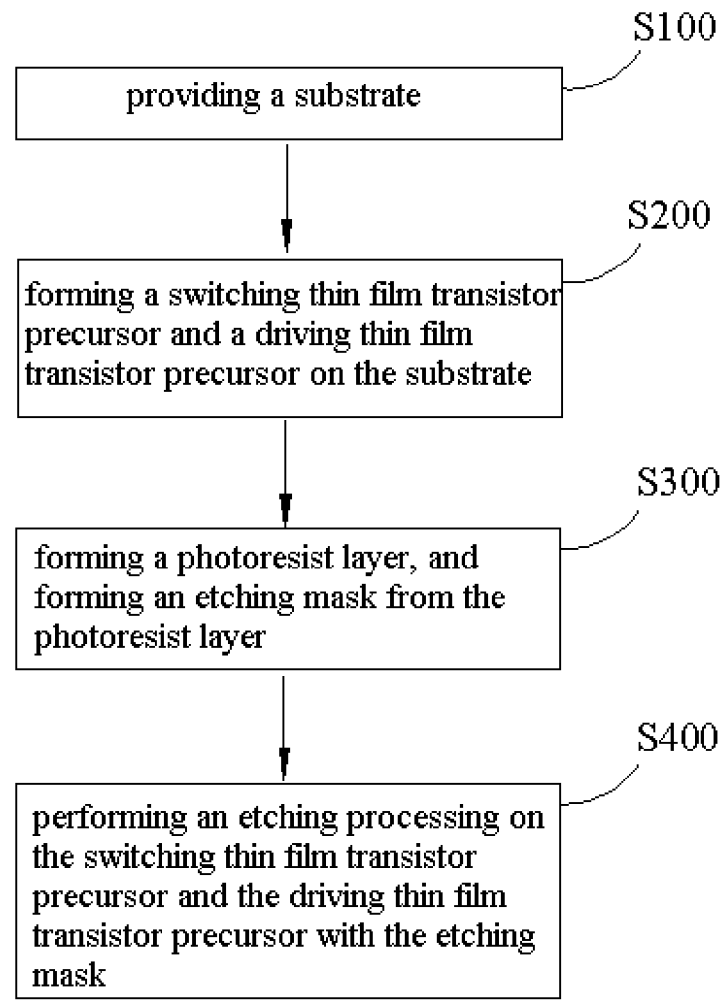
FIG. 1 illustrates a schematic flow chart of a method of preparing a display substrate according to an embodiment of the disclosure.

Embodiments of the present disclosure are described in detail below, and examples of the embodiments are illustrated in the drawings, wherein the same or similar reference numerals are used to refer to the same or similar elements or elements having the same or similar functions. The embodiments described below with reference to the accompanying drawings are intended to be illustrative for the present disclosure, and are not to be construed as limiting the present disclosure.

Embodiments of the disclosure are made on the basis of knowledge and founding of following facts and questions:

After an intensive and in-depth study and numerous experiments, in relevant art, due to restrictions of relevant process conditions, it is typically required to made switching TFTs and driving TFTs in the form of thin film transistors having identical parameters (e.g., having same line width), therefore it is unfavorable to exploit/bring respective properties of the switching TFTs and the driving TFTs into full play, which fact may in turn bring about abnormal operation, relatively poor display effect and the like. Specifically, the switching TFTs are merely required to ensure switching on and off of respective own TFTs for effectively controlling switching on and off of associated driving TFTs, without requiring a relatively large On-state current. And since the driving TFTs directly drive associated organic light-emitting diodes, respectively, then a relatively large On-state current may be required. However, in a condition that the switching TFTs and the driving TFTs adopt same parameters as above, then, on one hand, a requirement of a relatively small On-state current for the switching TFTs may not be satisfied, resulting in an unstable threshold voltage and in turn readily causing abnormal operations of the switching TFTs and downstream circuit elements or even the whole organic light-emitting display device; on the other hand, a requirement of a relatively large On-state current for the driving TFTs may also fail to be satisfied, resulting in a relatively large driving voltage which may be adverse to driving the elements, and finally causing a relatively poor display effect.

Accordingly, it is required to prepare the switching TFTs and the driving TFTs having different parameters respectively. By way of example, it is required to design a relatively large line width of a switching TFT so as to meet its requirement on a relatively small On-state current, and it is also required to design a relatively small line width of a driving TFT so as to meet its requirement on relatively large On-state current; in other words, it is required that the line width of each switching TFT as prepared is larger than the line width of each driving TFT as prepared.

However, in a relevant art, an increase in the line width of each switching TFT may result in an increased occupied area by the switching TFT, influencing pixel per inch (abbreviated as PPI), i.e., specifically decreasing PPI value; and a decrease in the line width of each driving TFT may require to adopt a fine line wet-etching technology which may result in risks that fine lines each of which is prepared to have a decreased line width may readily drop during etching and in turn impact on other structures or even break the other structures which are impacted, and the like. Therefore, a method of preparing switching TFT and driving TFT of different parameters is required, which has relatively simple processes and relatively high product yield.

Respective dimension and shape of each component in the drawings are only intended to exemplarily illustrate the contents of the disclosure, rather than to demonstrate the practical dimension or proportion of components of a display substrate and a display device according to embodiments of the disclosure.

In an aspect of embodiments of the disclosure, according to a general technical concept of the embodiments of the disclosure, by way of example, a method of preparing a display substrate is provided, which may prepare both a switching thin film transistor and a driving thin film transistor having different line widths, synchronously.

By way of example, in the method, above all, an etching mask is formed above a switching thin film transistor precursor and an etching mask is also formed a driving thin film transistor precursor, and the etching mask formed over the switching thin film transistor precursor and the etching mask formed over the driving thin film transistor precursor have different respective shapes (e.g., they have different thicknesses and different slope angles); and subsequently, these etching mask are utilized for performing a dry etching on a gate insulating material layer. In a process of the dry etching, since it is considered that, by using etching masks having different shapes, the effect of the dry etching may be directly influenced, then by way of example, by controlling process parameters of the dry etching, depending on respective designs of the etching mask above the switching thin film transistor precursor and the etching mask above the driving thin film transistor precursor, then a line width of a gate insulating layer of the switching thin film transistor is made larger than a line width of a gate insulating layer of the driving thin film transistor. Further, in the method, a portion of a semiconductor layer in a region outside a channel region is transformed into a conductor.

During the transformation into conductor, the larger the line width of the gate insulating layer of the switching thin film transistor as prepared already is, the larger a line width of a portion of the semiconductor layer covered by the gate insulating layer of the switching thin film transistor is; and in consideration that such a portion of the semiconductor layer is covered and thus fail to be transformed into the conductor and then constitutes an active layer of the switching thin film transistor, therefore, the larger the line width of the portion of the semiconductor layer covered by the gate insulating layer of the switching thin film transistor is, then the larger a line width of the active layer of the switching thin film transistor formed by the covered portion of semiconductor layer is. And During the transformation into conductor, the smaller of the gate insulating layer of the driving thin film transistor as prepared already is, the smaller a line width of a portion of the semiconductor layer covered by the gate insulating layer of the driving thin film transistor is; and in consideration that such a portion of the semiconductor layer is covered and thus fail to be transformed into the conductor and then constitutes an active layer of the driving thin film transistor, therefore, the smaller the line width of the portion of the semiconductor layer covered by the gate insulating layer of the driving thin film transistor is, then the smaller a line width of the active layer of the driving thin film transistor formed by the covered portion of semiconductor layer is. More specifically, during the transformation into conductor, the line widths of both the active layer and the gate insulating layer of the switching thin film transistor which are already prepared are formed to be relatively larger (as compared with the line widths of both the active layer and the gate insulating layer of the driving thin film transistor), thereby satisfying the requirement of the switching TFT for relatively smaller On-state current, resulting in a more stable threshold voltage without abnormal operation; at the same time, the line widths of both the active layer and the gate insulating layer of the driving thin film transistor which are already prepared are formed to be relatively smaller (as compared with the line widths of both the active layer and the gate insulating layer of the driving thin film transistor), thereby satisfying the requirement of the driving TFT for relatively larger On-state current, resulting in a relatively small required driving voltage which may be beneficial to driving the elements. In other words, with the etching masks prepared as above, by way of example, the switching thin film transistor and the driving thin film transistor having their respective thicknesses different from each other are prepared synchronously, with relatively simple processes and relatively high product yield, and thus a display substrate which has an enhanced overall display performance may be obtained on the basis of the switching thin film transistor and the driving thin film transistor having their respective thicknesses different from each other.

A top-gate type TFT has drawn extensive attention since it has a higher On-state current ($I_{on}$), a higher aperture ratio and a better TFT stability than a bottom-gate type TFT in OLED. Hereinafter, by taking the top gate type TFT as an example, the method according to embodiments of the disclosure are set forth in detail.

Specifically, by way of example, the method comprises:

S100: providing a substrate; and

S200: forming a switching thin film transistor precursor and a driving thin film transistor precursor on the substrate respectively.

In the step S100, according to embodiments of the disclosure, specific material of the substrate 100 as provided may not be restricted specifically, e.g., may be chosen as appropriate depending on practical conditions, as long as the material has a certain mechanical strength so as to provide a sufficient support for other structure(s) in constituting the display substrate.

Figure 2:
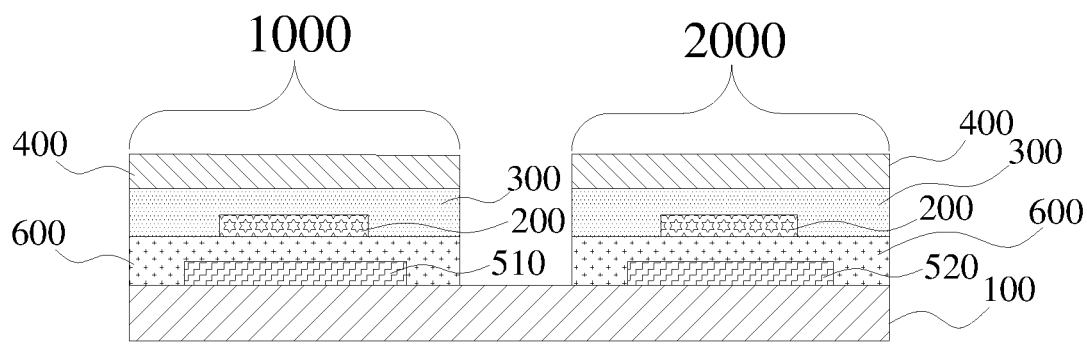
FIG. 2 illustrates a partial structural schematic view during processes in preparing the display substrate according to an embodiment of the disclosure.

In the step S200, as illustrated in FIG. 2, a switching thin film transistor precursor 1000 and a driving thin film transistor precursor 2000 are formed on the substrate 100 respectively, and are for example spaced apart from each other as illustrated. Each of the switching thin film transistor precursor 1000 and the driving thin film transistor precursor 2000 comprises a semiconductor layer 200, a gate insulating material layer 300 and a gate metallic layer 400 which are stacked sequentially above the substrate 100, and the semiconductor layer 200 of the switching thin film transistor precursor 1000 and the semiconductor layer 200 of the driving thin film transistor precursor 2000 are provided in a same layer, and the gate insulating material layer 300 of the switching thin film transistor precursor 1000 and the gate insulating material layer 300 of the driving thin film transistor precursor 2000 are provided in a same layer, and the gate metallic layer 400 of the switching thin film transistor precursor 1000 and the gate metallic layer 400 of the driving thin film transistor precursor 20000 are provided in a same layer. As used herein and hereinafter, the term "same layer" refers to a relationship between/among the layers simultaneously formed in a same step. The term "same layer" neither necessarily means that respective thicknesses/heights of the layers in a cross-sectional view should be the same, nor means that respective upper or lower surfaces of the layers are at a same level.

According to specific embodiments of the disclosure, the step of "forming the switching thin film transistor precursor 1000 and the driving thin film transistor precursor 2000 on the substrate respectively" comprises: above all, forming the semiconductor layer 200 of the switching thin film transistor precursor 1000 and the semiconductor layer 200 of the driving thin film transistor precursor 2000 above a side of the substrate 100; then, forming the gate insulating material layer 300 of the switching thin film transistor precursor 1000 and the gate insulating material layer 300 of the driving thin film transistor precursor 2000 on a side of respective semiconductor layers 200 facing away from the substrate 100, with an orthogonal projection of the gate insulating material layers 300 on the substrate 100 for example completely covering an orthogonal projection of respective semiconductor layers 200 on the substrate 100; and finally, forming the gate metallic layer 400 of the switching thin film transistor precursor 1000 and the gate metallic layer 400 of the driving thin film transistor precursor 20000 on a side of respective gate insulating material layers 300 facing away from respective semiconductor layers 200, an orthogonal projection of the gate metallic layers 400 on the substrate for example coinciding with the orthogonal projection of the gate insulating material layers 300 on the substrate 100. Thereby, it facilitates further enhancing performance of the display substrate prepared with the method.

According to embodiments of the disclosure, respective specific types, ways of formation, and thicknesses of the semiconductor layer 200 of the switching thin film transistor precursor 1000 and the semiconductor layer 200 of the driving thin film transistor precursor 2000 may not be specifically restricted. For example, the semiconductor layers 200 may for example be prepared by deposition of a layer of IGZO and formed into patterns of a channel layer, and may have a thickness for example ranging between 0.05 and 0.09 µm. According to embodiments of the disclosure, respective specific types, ways of formation, and thicknesses of the gate insulating material layer 300 of the switching thin film transistor precursor 1000 and the gate insulating material layer 300 of the driving thin film transistor precursor 2000 may also not be specifically restricted. For example, the gate insulating material layers 300 may for example be formed by deposition of a layer of silicon oxide and may have a thickness for example ranging between 0.1 and 0.2 µm. According to embodiments of the disclosure, respective specific types, ways of formation, and thicknesses of the gate metallic layer 400 of the switching thin film transistor precursor 1000 and the gate metallic layer 400 of the driving thin film transistor precursor 2000 may also not be specifically restricted. For example, the gate metallic layers 400 may for example be formed by deposition of a layer of metal (e.g., copper or aluminum) and may have a thickness for example ranging between 0.4 and 0.6 µm.

In order to further enhance the performance of the display substrate prepared with the method, before "forming the semiconductor layer 200 of the switching thin film transistor precursor 1000 and the semiconductor layer 200 of the driving thin film transistor precursor 2000 above a side of the substrate 100", the step of "forming the switching thin film transistor precursor 1000 and the driving thin film transistor precursor 2000 on the substrate respectively" further comprises: above all, forming a light-shielding layer 510 of the switching thin film transistor precursor and a light-shielding layer 520 of the driving thin film transistor precursor, by forming a light-shielding metal layer on the substrate 100 and patterning the light-shielding metal layer; and then, forming a buffer layer 600 of the switching thin film transistor precursor 1000 on a side of the light-shielding layer 510 of the switching thin film transistor precursor facing away from the substrate 100 and a buffer layer 600 of the driving thin film transistor precursor 2000 on a side of the light-shielding layer 520 of the driving thin film transistor precursor facing away from the substrate, respectively, and the buffer layer 600 of the switching thin film transistor precursor 1000 and the buffer layer 600 of the driving thin film transistor precursor 2000 are provided in a same layer. As such, it facilitates further enhancing performance of the display substrate prepared with the method.

According to embodiments of the disclosure, specific type, way of formation, and thickness of the light-shielding metal layer, and ways for patterning the light-shielding metal layer may not be specifically restricted. For example, the light-shielding metal layer may for example be formed by deposition of a layer of metal (e.g., molybdenum, or molybdenum-niobium alloy) on the substrate and may have a thickness for example ranging between 0.05 and 0.15 µm; and the light-shielding layer 510 of the switching thin film transistor precursor 1000 and the light-shielding layer 520 of the driving thin film transistor precursor 2000 may for example be formed by patterning the light-shielding metal layer.

According to embodiments of the disclosure, respective specific types, ways of formation, and thicknesses of the buffer layer 600 of the switching thin film transistor precursor 1000 and the buffer layer 600 of the driving thin film transistor precursor 2000 may not be specifically restricted. For example, the buffer layers 600 may for example be formed by deposition of a layer of silicon oxide and may have a thickness for example ranging between 0.3 and 0.5 μm. It should be noticed that, the switching thin film transistor precursor 1000 and the driving thin film transistor precursor 2000 may for example share one common buffer layer 600, or alternatively one common buffer layer 600 may for example be patterned to form the buffer layer of the switching thin film transistor precursor and the buffer layer of the driving thin film transistor precursor.

As illustrated in FIG. 1, for example, the method further comprises:

S300: forming a photoresist layer above the switching thin film transistor precursor and the driving thin film transistor precursor, and forming an etching mask from the photoresist layer.

Figure 3:
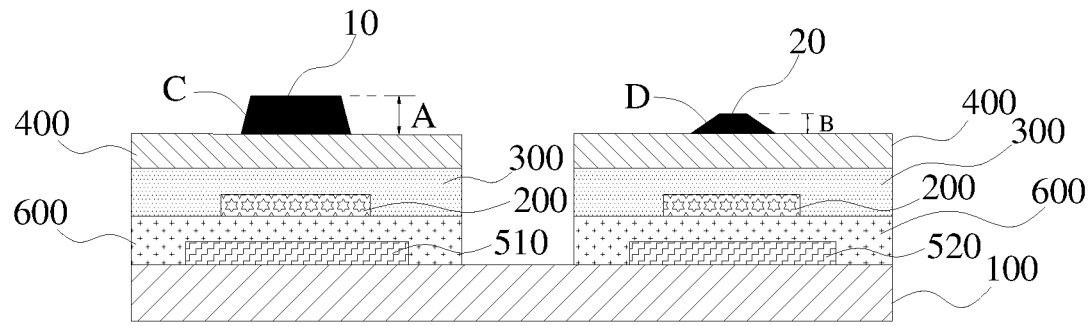
FIG. 3 illustrates a partial structural schematic view during processes in preparing the display substrate according to another embodiment of the disclosure.

In this step, a photoresist layer is formed above the switching thin film transistor precursor 1000 and the driving thin film transistor precursor 2000, and then the photoresist layer is formed into an etching mask (as labeled by reference numerals 10 and 20 as illustrated in FIG. 3), and a portion 10 of the etching mask at the switching thin film transistor precursor 1000 and a portion 20 of the etching mask at the driving thin film transistor precursor 2000 have different shapes. According to embodiments of the disclosure, specific type, and way of formation of the photoresist for forming the photoresist layer above the switching thin film transistor precursor and the driving thin film transistor precursor may not be specifically restricted, and may be selected as appropriate depending on practical conditions.

According to embodiments of the disclosure, the etching mask is formed by a half-tone mask exposure technology. In other words, for example, by taking advantage of partial transparency property of the half-tone mask exposure, the photoresist layer which is already formed may then be processed by an incomplete exposure. And since a half-tone mask is typically divided into a full light-transmission region, a semi light-transmission region and an opaque region, and also comprises a mask substrate and a translucent membrane. The mask substrate comprises a full light-transmission portion corresponding to the full light-transmission region and an opaque portion corresponding to the opaque region, and the translucent membrane is provided on the mask substrate and corresponding to the semi light-transmission region; and it is required to determine specific amount of light rays transmit through the translucent membrane depending on a desired height difference within the etching mask. Accordingly, after the exposure implemented on the photoresist layer, then for example, processes such as Post Exposure Baking (PEB), Exposure, Hard Baking (HB), etching and the like may also be performed thereon, so as to form a desired etching mask, such that in the etching mask thus formed, the portion 10 of the etching mask at the switching thin film transistor precursor and the portion 20 of the etching mask at the driving thin film transistor precursor have respective shapes different from each other. Thereby, in subsequent step(s), for example, the switching thin film transistor and the driving thin film transistor having different line widths may be prepared synchronously in a relatively simple manner, i.e., by utilizing the etching mask.

According to specific embodiments of the disclosure, in the etching mask thus formed, a thickness (i.e., a thickness labeled as 'A' as illustrated in FIG. 3) of the portion 10 of the etching mask at the switching thin film transistor precursor is larger than a thickness (i.e., a thickness labeled as 'B' as illustrated in FIG. 3) of the portion 20 of the etching mask at the driving thin film transistor precursor; and a slope angle of the portion 10 of the etching mask at the switching thin film transistor precursor is larger than a slope angle of portion 20 of the etching mask at the driving thin film transistor precursor. As such, by setting respective thicknesses and slope angles of the portion 10 of the etching mask at the switching thin film transistor precursor and the portion 20 of the etching mask at the driving thin film transistor precursor as required, it facilitates a simple formation of the etching mask. More specifically, for example, the thickness of portion of the etching mask at the switching thin film transistor precursor is 1.8 to 2.0 micrometers, and the slope angle of portion of the etching mask at the switching thin film transistor precursor is greater than or equal to 70 degrees; and according to specific embodiments of the disclosure, for example, the thickness of portion of the etching mask at the driving thin film transistor precursor is 1.0 to 1.2 micrometers, and the slope angle of portion of the etching mask at the driving thin film transistor precursor is greater than or equal to 30 degrees. As such, it facilitates a further enhancement of the performance of the display substrate prepared by the method. And it should be specifically noticed that, the expression "slope angle" should be comprehended/understood in a broad sense in embodiments of the disclosure, e.g., it may refer to an angle between a slope surface (i.e., an inclined side edge as illustrated) and a bottom surface (i.e., a bottom edge as illustrated) of a respective portion of the etching mask. By way of example, the slope angle of the portion 10 of the etching mask at the switching thin film transistor precursor is for example an acute angle within two angles formed between a slope surface (i.e., indicated by an inclined side edge C as illustrated) and a bottom surface (i.e., indicated by a bottom edge as illustrated), of the respective portion 10 of the etching mask; and the slope angle of the portion 20 of the etching mask at the driving thin film transistor precursor is for example an acute angle within two angles formed between a slope surface (i.e., indicated by an inclined side edge D as illustrated) and a bottom surface (i.e., indicated by a bottom edge as illustrated), of the respective portion 20 of the etching mask.

As illustrated in FIG. 1, for example, the method further comprises:

S400: forming a switching thin film transistor and a driving thin film transistor, by performing an etching processing on the switching thin film transistor precursor and the driving thin film transistor precursor with the etching mask.

In this step, the etching mask is utilized to perform the etching processing on the switching thin film transistor precursor 1000 and the driving thin film transistor precursor 2000, respectively, so as to form the etched switching thin film transistor precursor 1000 into the switching thin film transistor and to form the etched driving thin film transistor precursor 2000 into the driving thin film transistor precursor. As such, it may facilitate preparing the switching thin film transistor and the driving thin film transistor having different line widths synchronously in a relatively simple manner, by utilizing the etching mask.

Figure 4:
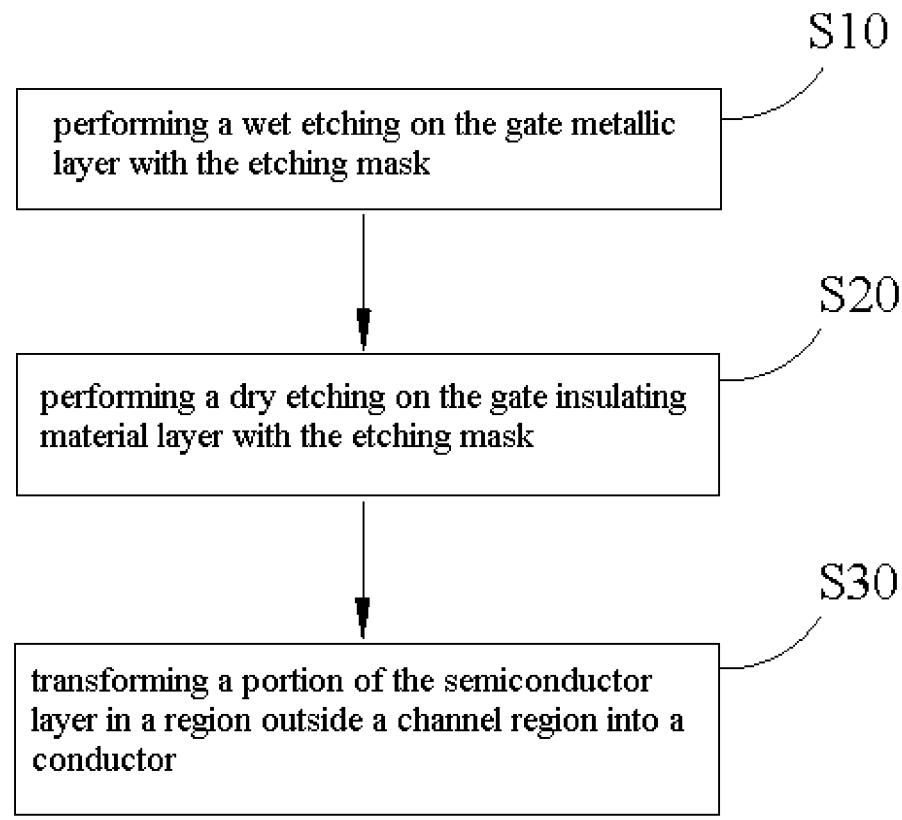
FIG. 4 illustrates a schematic partial flow chart of preparing the display substrate according to an embodiment of the disclosure.

According to embodiments of the disclosure, as illustrated in FIG. 4, above etching processing comprises:

S10: forming a gate of the switching thin film transistor and a gate of the driving thin film transistor respectively, by performing a wet etching on the gate metallic layer with the etching mask.

Figure 5:
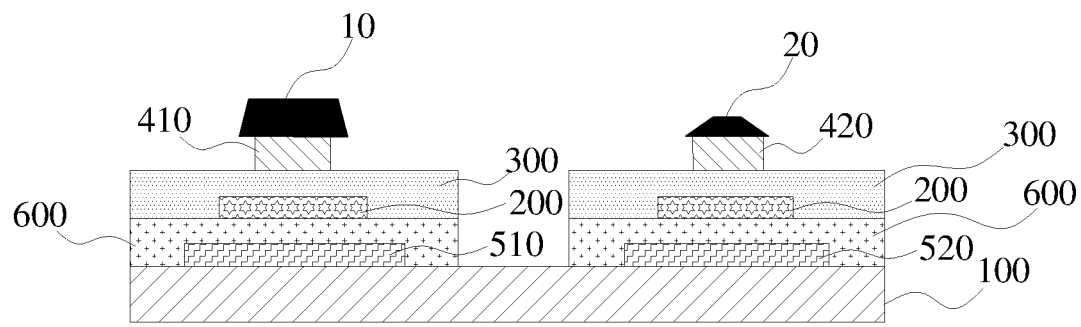
FIG. 5 illustrates a partial structural schematic view during processes in preparing the display substrate according to an embodiment of the disclosure.

Specifically, in this step, as illustrated in FIG. 5, the gate metallic layer 400 is processed by the wet etching above all, so as to form a gate 410 of the switching thin film transistor and a gate 420 of the driving thin film transistor respectively. According to embodiments of the disclosure, line widths of both the gate 410 of the switching thin film transistor and the gate 420 of the driving thin film transistor may not be specifically restricted, for example may be selected depending on practical requirements. By way of example, by controlling process parameters of the wet etching, the line width of the prepared gate 410 of the switching thin film transistor is smaller than a line width of the portion 10 of the etching mask at the switching thin film transistor precursor, and the line width of the prepared gate 420 of the driving thin film transistor is smaller than a line width of the portion 20 of the etching mask at the driving thin film transistor precursor.

According to embodiments of the disclosure, a specific way of performing the wet etching may not be restricted specifically, for example, in a condition that the gate metallic layer 400 is formed by copper, the wet etching is performed by using hydrogen peroxide; alternatively, for example, in a condition that the gate metallic layer 400 is formed by aluminum, the wet etching is performed by using mixed acid. And an etching time period for performing the wet etching may also not be restricted specifically, for example, the etching time period may be specifically determined depending on a critical dimension bias (abbreviated as CD Bias) which ranges between −2 and 3 µm after the etching processing.

According to embodiments of the disclosure, as illustrated in FIG. 4, above etching processing further comprises:

S20: forming a gate insulating layer of the switching thin film transistor and a gate insulating layer of the driving thin film transistor respectively, by performing a dry etching on the gate insulating material layer with the etching mask.

Figure 6:
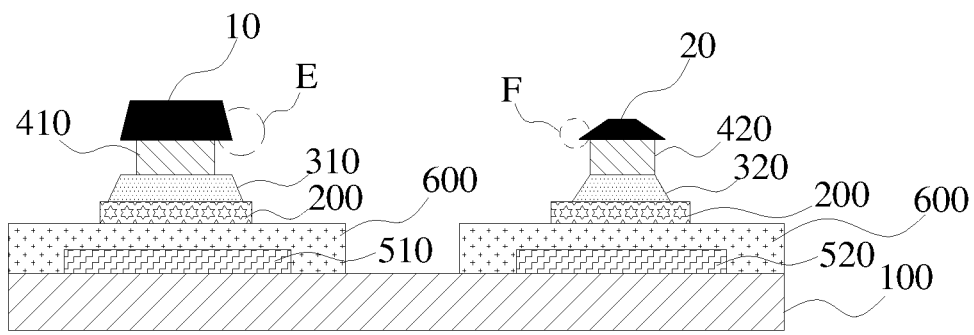
FIG. 6 illustrates a partial structural schematic view during processes in preparing the display substrate according to another embodiment of the disclosure.

Specifically, in this step, as illustrated in FIG. 6, the gate insulating material layer is processed by the dry etching, with the etching mask, so as to form a gate insulating layer 310 of the switching thin film transistor and a gate insulating layer 320 of the driving thin film transistor, respectively. In other words, after the wet etching as above, it is required to reserve the etching mask; and the gate insulating material layer 300 is processed by the dry etching by utilizing etching mask is utilized once again.

According to embodiments of the disclosure, a line width of the gate insulating layer 310 of the switching thin film transistor is larger than a line width of the gate insulating layer 320 of the driving thin film transistor. As such, it facilitates a further enhancement of the display substrate which is prepared by the method. It has been found that, since the portion 10 of the etching mask at the switching thin film transistor precursor and the portion 20 of the etching mask at the driving thin film transistor precursor have different shapes, and the portion 10 of the etching mask at the switching thin film transistor precursor has a larger thickness and a larger slope angle as compared with the portion 20 of the etching mask at the driving thin film transistor precursor, then, a suspended portion (for example, a region 'E' as illustrated in FIG. 6) of the portion 10 of the etching mask at the switching thin film transistor precursor may not be readily processed by a transverse ashing with a gas which is used to perform the dry etching, such that the line width of the suspended portion of the portion 10 of the etching mask at the switching thin film transistor precursor may not be changed significantly, and in turn the gate insulating material layer 300 below the portion 10 of the etching mask at the switching thin film transistor precursor may be reserved relatively more, i.e., there may be a relatively more unetched portion of the gate insulating material layer 300 below the portion 10 of the etching mask at the switching thin film transistor precursor which may thus be reserved, and therefore the line width of the prepared gate insulating layer 310 of the switching thin film transistor is relatively larger. And the portion 20 of the etching mask at the driving thin film transistor precursor has a smaller thickness and a smaller slope angle as compared with the portion 10 of the etching mask at the switching thin film transistor precursor, then, a suspended portion (for example, a region 'F' as illustrated in FIG. 6) of the portion 20 of the etching mask at the driving thin film transistor precursor may be readily processed by a transverse ashing with the gas which is used to perform the dry etching, and the suspended portion of the portion 20 of the etching mask at the driving thin film transistor precursor may in turn recede since it is processed by the transverse ashing applied with the gas which is used to perform the dry etching, such that the line width of the suspended portion of the portion 20 of the etching mask at the driving thin film transistor precursor may become smaller which fact causes that more portions of the gate insulating material layer 300 may be exposed, and in turn the gate insulating material layer 300 below the portion 20 of the etching mask at the driving thin film transistor precursor may be reserved relatively less, i.e., there may be a relatively less unetched portion of the gate insulating material layer 300 below the portion 20 of the etching mask at the driving thin film transistor precursor which may thus be reserved, and therefore the line width of the prepared gate insulating layer 320 of the driving thin film transistor is relatively smaller. In other words, the gate insulating layer 310 of the switching thin film transistor and the gate insulating layer 320 of the driving thin film transistor having different line-widths may be obtained by a design of the etching mask and a setting of the gas which is used to perform the dry etching (e.g., a proportional combination of gases).

According to embodiments of the disclosure, specific type, and magnitude of gas flow of the gas which is used to perform the dry etching may not be specifically restricted, as long as a requirement that a desired gate insulating layer may be obtained is satisfied. By way of example, according to embodiments of the disclosure, the gas which is used to perform the dry etching is for example a gas mixture of $CF_4$ and $O_2$; a gas flow of $CF_4$ is 2200 to 1800 sccm, and a gas flow of $O_2$ is 1000 to 1400 sccm; and a percentage of $O_2$ within the gas mixture is 30% to 40%. According to embodiments of the disclosure, in addition to above etching process which intends to form desired target structures (i.e., which is referred to as 'main etch', abbreviated as ME), there may be provided additionally with a process of 'over etch' (abbreviated as OE), and a time for performing OE is for example 20% to 30% of a time for performing ME. Thereby, the time for performing OE, which is additionally provided, facilitates compensating for any etch unevenness which occurs in ME and any deposition unevenness which occurs in etching a target film layer, and further enhancing the performance of the display substrate prepared by the method.

According to embodiments of the disclosure, in a condition that the thickness of portion of the etching mask at the switching thin film transistor precursor is 1.8 to 2.0 micrometers, and the slope angle of portion of the etching mask at the switching thin film transistor precursor is greater than or equal to 70 degrees, and the thickness of portion of the etching mask at the driving thin film transistor precursor is 1.0 to 1.2 micrometers, and the slope angle of portion of the etching mask at the driving thin film transistor precursor is greater than or equal to 30 degrees, once the dry etching applied on the gate insulating material layer is completed, then the slope angle of the gate insulating layer 310 of the switching thin film transistor may for example be 50 degrees to 60 degrees, and the slope angle of the gate insulating layer 320 of the driving thin film transistor may for example be 30 degrees to 40 degrees. As such, it facilitates a further enhancement of the performance of the display substrate.

According to embodiments of the disclosure, as illustrated in FIG. 4, above etching processing further comprises:

S30: forming an active layer and connecting lines of the switching thin film transistor and an active layer and connecting lines of the driving thin film transistor, by transforming a portion of the semiconductor layer in a region outside a channel region into a conductor.

Figure 7:
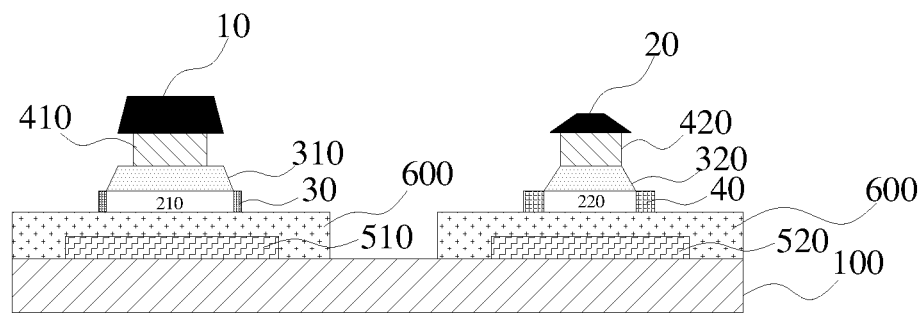
FIG. 7 illustrates a partial structural schematic view during processes in preparing the display substrate according to still another embodiment of the disclosure.

Specifically, in this step, as illustrated in FIG. 7, a portion of the semiconductor layer 200 in a region outside a channel region is transformed into a conductor, so as to form an active layer 210 and connecting lines 30 of the switching thin film transistor, and an active layer 220 and connecting lines 40 of the driving thin film transistor. More specifically, the portion of the semiconductor layer 200 in the region outside the channel region at the switching thin film transistor precursor is transformed into a conductor, and it in turn constitutes the connecting lines 30 of the switching thin film transistor; and the portion of the semiconductor layer 200 in the region inside the channel region at the switching thin film transistor precursor is not covered and thus fails to transform into any conductor, and it in turn constitutes the active layer 210 of the switching thin film transistor. Similarly, the portion of the semiconductor layer 200 in the region outside the channel region at the driving thin film transistor precursor is transformed into a conductor, and it in turn constitutes the connecting lines 40 of the driving thin film transistor; and the portion of the semiconductor layer 200 in the region inside the channel region at the driving thin film transistor precursor is not covered and thus fails to transform into any conductor, and it in turn constitutes the active layer 220 of the driving thin film transistor. As such, it facilitates preparing the switching thin film transistor and the driving thin film transistor having different line widths synchronously in a relatively simple manner. According to embodiments of the disclosure, the formed connecting lines 30 of the switching thin film transistor and the formed connecting lines 40 of the driving thin film transistor may for example be used independently for connecting other circuit structures.

According to embodiments of the disclosure, a line width of the active layer 210 of the switching thin film transistor is larger than a line width of the active layer 220 of the driving thin film transistor. As such, it facilitates further enhancing the performance of the display substrate prepared by the method. It has been found that, when the portion of the semiconductor layer 200 in the region outside the channel region is transformed into a conductor, since as compared with conditions of the formed driving thin film transistor, the formed gate insulating layer 310 of the switching thin film transistor has a relatively larger line width, and thus the portion of the semiconductor layer 200 covered by the formed gate insulating layer 310 of the switching thin film transistor also has a relatively larger line width, and is covered and thus fails to transform into any conductor and thereby constitutes the active layer 210 of the switching thin film transistor; as such, the formed active layer 210 of the switching thin film transistor has a relatively larger line width, and accordingly, the portion of the semiconductor layer 200 transformed into a conductor has a relatively smaller line width and accordingly constitutes the connecting lines 30 of the switching thin film transistor. And as compared with conditions of the formed switching thin film transistor, the formed gate insulating layer 320 of the driving thin film transistor has a relatively smaller line width, and thus the portion of the semiconductor layer 200 covered by the formed gate insulating layer 320 of the driving thin film transistor also has a relatively smaller line width, and is covered and thus fails to transform into any conductor and thereby constitutes the active layer 220 of the driving thin film transistor; as such, the formed active layer 220 of the driving thin film transistor has a relatively smaller line width, and accordingly, the portion of the semiconductor layer 200 transformed into a conductor has a relatively larger line width and accordingly constitutes the connecting lines 40 of the driving thin film transistor. Therefore, the active layer 210 of the switching thin film transistor has a relatively larger line width and thus satisfies its requirement on relatively smaller On-state current, with a more stable threshold voltage, satisfying its requirement on a relatively smaller On-state current, resulting in a more stable threshold voltage without abnormal operation; and at the same time, the active layer 220 of the driving thin film transistor has a relatively smaller line width and thus satisfies its requirement on a relatively larger On-state current, resulting in a relatively smaller required driving voltage which may be beneficial to driving the elements. In other words, with the method, it facilitates that the switching thin film transistor and the driving thin film transistor having their respective thicknesses different from each other are prepared synchronously, with relatively simple processes and relatively high product yield, and thus a display substrate which has an enhanced overall display performance may be obtained.

According to embodiments of the disclosure, a specific way of transformation into a conductor may not be restricted specifically, and for example may be selected as appropriate depending on practical requirements. By way of example, according to embodiments of the disclosure, He or NH$_3$ may be used to perform the transformation into a conductor.

Figure 8:
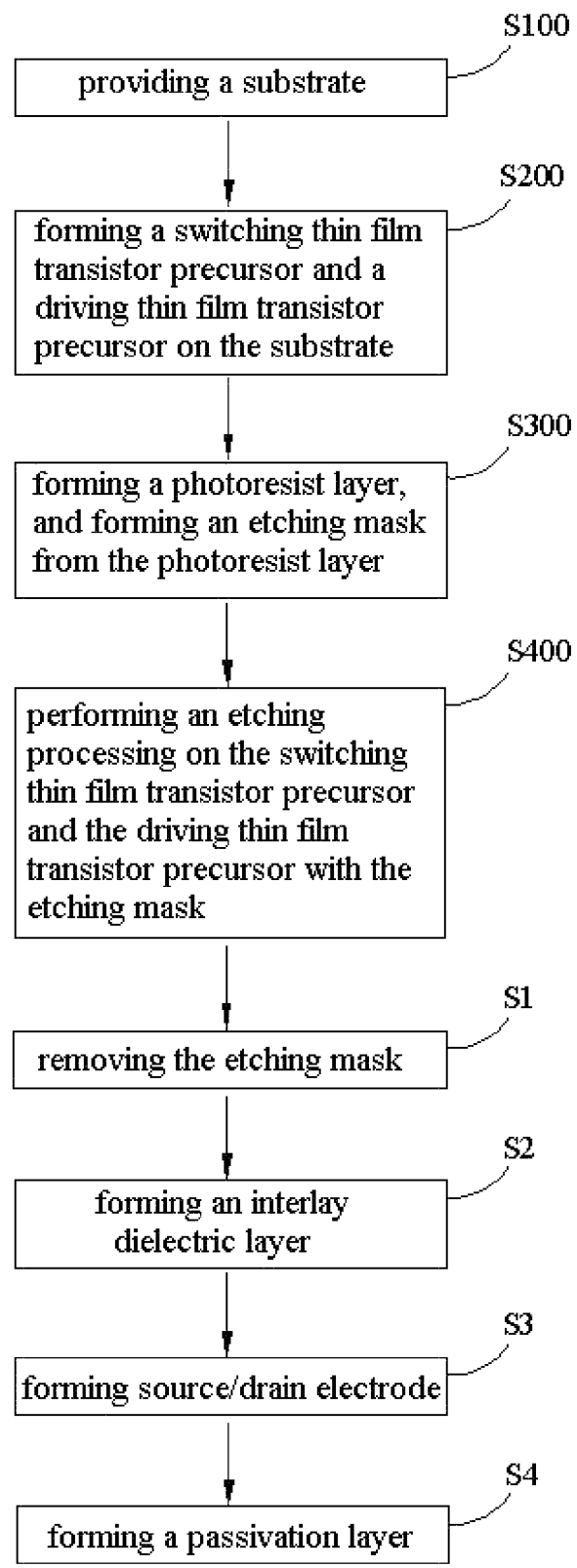
FIG. 8 illustrates a flow chart of the OLED display substrate according to embodiments of the disclosure.

According to embodiments of the disclosure, as illustrated in FIG. 8, after above etching processing is completed, the method further comprises:

S1: removing the etching mask.

According to embodiments of the disclosure, a specific way of removing the etching mask may not be restricted specifically, and for example may be selected as appropriate depending on practical requirements. By way of example, according to embodiments of the disclosure, the dry etching process may be used to peel off the etching mask.

According to embodiments of the disclosure, as illustrated in FIG. 8, after above processing of removing the etching mask is completed, the method further comprises:

S2: forming an interlay dielectric layer, for example on a side of the gate of the switching thin film transistor facing away from the substrate and on a side of the gate of the driving thin film transistor facing away from the substrate.

Figure 9:
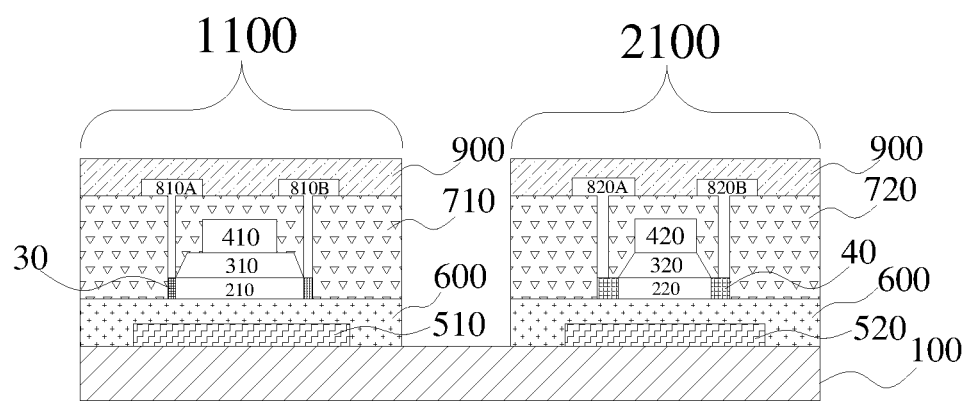
FIG. 9 illustrates a structural schematic view of a display substrate according to an embodiment of the disclosure.

Specifically, in this step, as illustrated in FIG. 9, an interlayer dielectric layer (e.g., reference numerals 710 and 720 as illustrated in FIG. 7) is formed on a side of the gate 410 of the switching thin film transistor facing away from the substrate 100 and on a side of the gate 420 of the driving thin film transistor facing away from the substrate 100. More specifically, for example, as illustrated in FIG. 9, the portion 710 of the interlayer dielectric layer of the switching thin film transistor covers the gate 410 of the switching thin film transistor, a portion of the gate insulating layer 310 which is not covered by the gate 410, and the connecting lines 30; and the portion 720 of the interlayer dielectric layer of the driving thin film transistor covers the gate 420 of the driving thin film transistor, a portion of the gate insulating layer 320 which is not covered by the gate 420, and the connecting lines 40.

According to embodiments of the disclosure, specific type, specific way of formation, and thickness of the interlay dielectric layer may not be specifically restricted. By way of example, a layer of silicon oxide having a thickness ranging between 0.3 and 0.5 µm is deposited above all and then patterned, so as to form the portion 710 of the interlayer dielectric layer of the switching thin film transistor (the portion 710 for example has at least one first via-hole), and to form the portion 720 of the interlayer dielectric layer of the driving thin film transistor (the portion 720 for example has at least one second via-hole). More specifically, the deposited layer of silicon oxide is etched above all so as to form the portion of the interlay dielectric layer of the switching thin film transistor and the portion of the interlayer dielectric layer of the driving thin film transistor, then, both the portion of the interlay dielectric layer of the switching thin film transistor and the portion of the interlayer dielectric layer of the driving thin film transistor are processed by the dry etching respectively so as to form respectively the at least one first via-hole passing through the portion of the interlay dielectric layer of the switching thin film transistor and the at least one second via-hole passing through the portion of the interlayer dielectric layer of the driving thin film transistor, for example by utilizing $CF_4/O_2$, at a relatively high power and under a relatively low pressure. Once above two etchings are completed, finally a wet peeling-off is performed so as to finally form the portion 710 of the interlayer dielectric layer of the switching thin film transistor having the at least one first via-hole and the portion 720 of the interlayer dielectric layer of the driving thin film transistor having the at least one second via-hole.

According to embodiments of the disclosure, as illustrated in FIG. 8, after above processing of forming an interlay dielectric layer is completed, the method further comprises:

S3: forming source/drain electrode, e.g., on a side of the interlay dielectric layer facing away from the substrate.

Specifically, in this step, source/drain electrode 810 (i.e., reference numerals 810A and 810B as illustrated in FIG. 9) of the switching thin film transistor is formed on a side of the portion 710 of the interlayer dielectric layer facing away from the substrate 100, and source/drain electrode 820 (i.e., reference numerals 820A and 820B as illustrated in FIG. 9) of the driving thin film transistor is formed on a side of the portion 720 of the interlayer dielectric layer facing away from the substrate 100, respectively. The source/drain electrode 810 of the switching thin film transistor may extend through inside of the at least one first via-hole and electrically connects with the connecting lines 30 of the switching thin film transistor, and the source/drain electrode 820 of the driving thin film transistor may extend through inside of the at least one second via-hole and electrically connects with the connecting lines 40 of the driving thin film transistor.

According to embodiments of the disclosure, specific types, specific ways of formation, and thicknesses of the source/drain electrode 810 of the switching thin film transistor and the source/drain electrode 820 of the driving thin film transistor may not be specifically restricted. By way of example, by depositing a layer of metal layer (e.g., copper or aluminum) having a thickness ranging between 0.5 and 0.7 µm, and then performing a wet etching on the deposited metal layer with a source/drain electrode mask, then the desired source/drain electrode 810 of the switching thin film transistor and desired source/drain electrode 820 of the driving thin film transistor may be formed. More specifically, the source/drain electrode 810A of the switching thin film transistor is for example a source of the switching thin film transistor, and the source/drain electrode 810B of the switching thin film transistor is for example a drain of the switching thin film transistor; and a source/drain electrode 820A of the driving thin film transistor is for example a source of the driving thin film transistor, and the source/drain electrode 820B of the driving thin film transistor is for example a drain of the driving thin film transistor.

According to embodiments of the disclosure, as illustrated in FIG. 8, after above processing of forming source/drain electrode is completed, the method further comprises:

S4: forming a passivation layer, e.g., on a side of the source/drain electrode of the switching thin film transistor facing away from the substrate and on a side of the source/drain electrode of the driving thin film transistor facing away from the substrate.

Specifically, in this step, a passivation layer 900 is formed on a side of the source/drain electrode 810 of the switching thin film transistor facing away from the substrate 100 and on a side of the source/drain electrode 820 of the driving thin film transistor facing away from the substrate 100. More specifically, for example as illustrated in FIG. 9, the passivation layer of the switching thin film transistor covers the source/drain electrode 810A and 810B of the switching thin film transistor, and a portion of an upper surface of the portion 710 of the interlayer dielectric layer which is not covered by the source/drain electrode 810A and 810B; and the passivation layer of the driving thin film transistor covers the source/drain electrode 820A and 820B of the driving thin film transistor, and a portion of an upper surface of the portion 720 of the interlayer dielectric layer which is not covered by the source/drain electrode 820A and 820B. As such, it facilitates further enhancing the performance of the display substrate prepared by the method.

According to embodiments of the disclosure, specific type, specific way of formation, and thicknesses of the passivation layer 900 may not be specifically restricted. By way of example, a layer of SiO, or a combination of SiO and SiN is deposited, with a thickness for example ranging between 0.3 and 0.4 µm. It should be noticed that, the switching thin film transistor and the driving thin film transistor for example share the passivation layer, or for example the passivation layer is patterned so as to form a respective portion of the passivation layer of the switching thin film transistor and a respective portion of the passivation layer of the driving thin film transistor.

To sum up, the method has relatively simple processes and relatively high product yield, facilitating preparing the switching thin film transistor and the driving thin film transistor having different line widths synchronously; and in the display substrate prepared by the method, the line width of the switching thin film transistor is relatively larger, thereby satisfying the requirement of the switching TFT for relatively smaller On-state current, resulting in a more stable threshold voltage without abnormal operation; at the same time, the line width of the driving thin film transistor is relatively smaller, thereby satisfying the requirement of the driving TFT for relatively larger On-state current, resulting in a relatively small required driving voltage which may be beneficial to driving the elements, enhancing overall display performance of the display substrate.

In another aspect of embodiments of the disclosure, a display substrate is further provided. As illustrated in FIG. 9, the display substrate comprises: a substrate 100; and a switching thin film transistor 1100 and a driving thin film transistor 2100 on the substrate 100. According to embodiments of the disclosure, an active layer 210 of the switching thin film transistor 1100 and an active layer 220 of the driving thin film transistor 2100 are formed in a same layer by a same material, and each of the switching thin film transistor 1100 and the driving thin film transistor 2100 has respective connecting lines 30, 40 formed on a basis of a transformation of material of respective active layers into conductor, a line width of the connecting lines 30 of the switching thin film transistor being smaller than a line width of the connecting lines 40 of the driving thin film transistor. The display substrate is for example prepared by aforementioned method, thus facilitating implementation of all characteristics and advantages possessed by aforementioned method, without repeating herein any more. In general, the display substrate is prepared with relatively simple processes and relatively high product yield; and in the display substrate, the line width of the switching thin film transistor is relatively larger, thereby satisfying the requirement of the switching TFT for relatively smaller On-state current, resulting in a more stable threshold voltage without abnormal operation; and the line width of the driving thin film transistor is relatively smaller, thereby satisfying the requirement of the driving TFT for relatively larger On-state current, resulting in a relatively small required driving voltage which may be beneficial to driving the elements, enhancing overall display performance of the display substrate.

It should be noticed that, the switching thin film transistor 1100 for example further comprises a light-shielding layer 510, a buffer layer 600, a gate insulating layer 310, a gate 410, a portion 710 of an interlay dielectric layer, a source/drain electrode 810 (i.e., reference numerals 810A and 810B as illustrated in FIG. 9) and a passivation layer 900, all of which are depicted in detail as above, without repeating herein any more. The driving thin film transistor 2100 for example further comprises a light-shielding layer 520, a buffer layer 600, a gate insulating layer 320, a gate 420, a portion 720 of an interlay dielectric layer, a source/drain electrode 820 (i.e., reference numerals 820A and 820B as illustrated in FIG. 9) and a passivation layer 900, all of which are depicted in detail as above, without repeating herein any more.

According to embodiments of the disclosure, a slope angle of the gate insulating layer of the switching thin film transistor ranges between 50 and 60 degrees, and a slope angle of the gate insulating layer of the driving thin film transistor ranges between 30 and 40 degrees. As such, it facilitates further enhancing the performance of the display substrate.

According to embodiments of the disclosure, the switching thin film transistor and the driving thin film transistor within the display substrate are formed by performing an etching process on the switching thin film transistor precursor and the driving thin film transistor precursor respectively. According to embodiments of the disclosure, a relatively larger line width of the gate insulating layer and the active layer of the switching thin film transistor, and a relatively smaller line width of the gate insulating layer and the active layer of the driving thin film transistor may be obtained, by a design of the etching mask and a setting of the gas which is used to perform the dry etching (e.g., a proportional combination of gases). In other words, the switching thin film transistor and the driving thin film transistor having different line-widths may be obtained synchronously. According to embodiments of the disclosure, respective specific types, ways of formation, and thicknesses of various layers of structures in the switching thin film transistor and the driving thin film transistor are set forth in detail as above, without repeating herein any more.

Figure 10:
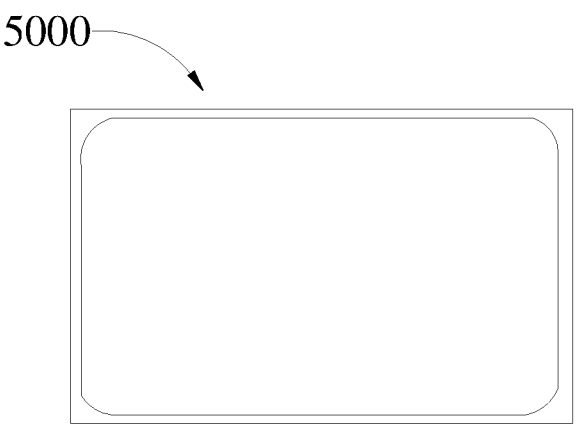
FIG. 10 illustrates a structural schematic view of a display substrate according to an embodiment of the disclosure.

In still another aspect of embodiments of the disclosure, a display device is further provided. As illustrated in FIG. 10, the display device 5000 comprises the display substrate prepared with the method as above, or the display substrate as above. Thereby, the display device facilitates implementation of all characteristics and advantages possessed by aforementioned method or aforementioned display substrate, without repeating herein any more. According to embodiments of the disclosure, in a condition that the display substrate is applied in the display device 5000, a specific type of the display device 5000 may not be specifically restricted, and for example may be selected as appropriate depending on practical requirements. According to embodiments of the disclosure, the display substrate 5000 is for example used for OLED or LCD. According to specific embodiments of the disclosure, the display substrate 5000 is for example used for large-sized OLED. In general, the display device is prepared with relatively simple processes and relatively high product yield; and in the display device, the line width of the switching thin film transistor is relatively larger, thereby satisfying the requirement of the switching TFT for relatively smaller On-state current, resulting in a more stable threshold voltage without abnormal operation; and the line width of the driving thin film transistor is relatively smaller, thereby satisfying the requirement of the driving TFT for relatively larger On-state current, resulting in a relatively small required driving voltage which may be beneficial to driving the elements, enhancing overall display performance of the display substrate.

In depiction of the embodiments of the disclosure, it should be comprehended that, any orientative or positional relationship indicated by terminologies "upper", "lower", and so on is based on orientative or positional relationship as illustrated in accompanied drawings, only intending to facilitate depictions of embodiments of the disclosure, rather than requiring/restricting the embodiments of the disclosure to be constructed and operated at a certain orientation, therefore, such terminologies should not be comprehended as limitations to embodiments of the disclosure.

In depictions herein, description referring to terminologies such as "an embodiment", "embodiments", "example", "specific example" or "examples" may mean that specific feature(s), structure(s), material or characteristics in combination therewith may be contained within at least one embodiment or example of the disclosure. In the description, illustrative expressions concerning above terminologies may not necessarily refer to same embodiment(s)/example(s). Furthermore, specific feature(s), structure(s), material or characteristics as depicted may be combined mutually in any one or more of embodiments or examples appropriately. In addition, it may occur to those skilled to join and combine different embodiments or examples as depicted herein. In addition, terminologies "first", "second" may only intend to be used for depiction, rather than intending to be comprehended to indicate or imply relative importance or to indicate impliedly specific number of technical features as mentioned.

Although the embodiments disclosed in the present disclosure are as described and illustrated above, they are merely provided exemplarily, and are not intended to limit the present disclosure. Any modifications and variations may be made by those skilled in the art in terms of form and detail without departing from the spirit and scope of the present disclosure, but the scope of the present disclosure is defined by the appended claims.

What is claimed is:

1. A method of preparing a display substrate, comprising:
providing a substrate;
forming a switching thin film transistor precursor and a driving thin film transistor precursor on the substrate respectively, each of the switching thin film transistor precursor and the driving thin film transistor precursor comprising a semiconductor layer, a gate insulating material layer and a gate metallic layer which are stacked sequentially above the substrate;
forming a photoresist layer above the switching thin film transistor precursor and the driving thin film transistor precursor, and forming an etching mask from the photoresist layer, a first portion of the etching mask at the switching thin film transistor precursor and a second portion of the etching mask at the driving thin film transistor precursor having different shapes; and
forming a switching thin film transistor and a driving thin film transistor, by performing an etching processing on the switching thin film transistor precursor and the driving thin film transistor precursor with the etching mask,
wherein performing the etching processing on the switching thin film transistor precursor and the driving thin film transistor precursor comprises:
forming a gate of the switching thin film transistor and a gate of the driving thin film transistor by performing a wet etching on the gate metallic layer with the etching mask;
forming a gate insulating layer of the switching thin film transistor and a gate insulating layer of the driving thin film transistor by performing a dry etching on the gate insulating material layer merely with the etching mask; and
forming an active layer and connecting lines of the switching thin film transistor, and an active layer and connecting lines of the driving thin film transistor, by transforming a portion of the semiconductor layer in a region outside a channel region into a conductor, and
wherein the etching mask is formed by a half-tone mask exposure technology, and wherein:
a thickness of the first portion of the etching mask at the switching thin film transistor precursor is larger than a thickness of the second portion of the etching mask at the driving thin film transistor precursor; and
a slope angle of the first portion of the etching mask at the switching thin film transistor precursor is larger than a slope angle of the second portion of the etching mask at the driving thin film transistor precursor.

2. The method according to claim 1, wherein:
the thickness of the first portion of the etching mask at the switching thin film transistor precursor is 1.8 to 2.0 micrometers, and the slope angle of the first portion of the etching mask at the switching thin film transistor precursor is greater than or equal to 70 degrees; and
the thickness of the second portion of the etching mask at the driving thin film transistor precursor is 1.0 to 1.2 micrometers, and the slope angle of the second portion of the etching mask at the driving thin film transistor precursor is greater than or equal to 30 degrees.

3. The method according to claim 1, wherein a line width of the gate insulating layer of the switching thin film transistor is larger than a line width of the gate insulating layer of the driving thin film transistor.

4. The method according to claim 1, wherein a line width of the active layer of the switching thin film transistor is larger than a line width of the active layer of the driving thin film transistor.

5. The method according to claim 1, wherein a gas which is used to perform the dry etching is a gas mixture of $CF_4$ and $O_2$;
wherein a gas flow of $CF_4$ is 2200 to 1800 sccm, and a gas flow of $O_2$ is 1000 to 1400 sccm, and
wherein a percentage of $O_2$ within the gas mixture is 30% to 40%.

6. The method according to claim 1, wherein the step of forming the switching thin film transistor precursor and the driving thin film transistor precursor on the substrate respectively comprises:
forming the semiconductor layer on the substrate;
forming the gate insulating material layer on a side of the semiconductor layer facing away from the substrate; and
forming the gate metallic layer on a side of the gate insulating material layer facing away from the semiconductor layer.

7. The method according to claim 6, wherein prior to forming the semiconductor layer, the step of forming the switching thin film transistor precursor and the driving thin film transistor precursor on the substrate respectively further comprises:
forming a light-shielding layer of the switching thin film transistor precursor and a light-shielding layer of the driving thin film transistor precursor, by forming a light-shielding metal layer on the substrate and patterning the light-shielding metal layer; and
forming a buffer layer on a side of the light-shielding layer of the switching thin film transistor precursor facing away from the substrate and on a side of the light-shielding layer of the driving thin film transistor precursor facing away from the substrate.

8. The method according to claim 1, wherein after the step of performing the etching processing on the switching thin film transistor precursor and the driving thin film transistor precursor, the method further comprises:
removing the etching mask;
forming an interlay dielectric layer, on a side of the gate of the switching thin film transistor facing away from the substrate and on a side of the gate of the driving thin film transistor facing away from the substrate;
forming source/drain electrode of the switching thin film transistor and source/drain electrode of the driving thin film transistor, on a side of the interlay dielectric layer facing away from the substrate; and
forming a passivation layer on a side of the source/drain electrode of the switching thin film transistor facing away from the substrate and on a side of the source/drain electrode of the driving thin film transistor facing away from the substrate.

9. A display device, comprising the display substrate prepared with the method according to claim 1.

* * * * *